Feb. 21, 1967 D. M. JAHN 3,305,733

COMPLEMENTARY SYMMETRY DIFFERENTIAL PULSE INTEGRATOR

Filed July 1, 1963

INVENTOR.
DALE M. JAHN
BY
Robert J. Haase
ATTORNEY

United States Patent Office 3,305,733

Patented Feb. 21, 1967

3,305,733

COMPLEMENTARY SYMMETRY DIFFERENTIAL PULSE INTEGRATOR

Dale M. Jahn, Garden City, N.Y., assignor to Sperry Rand Corporation, Great Neck, N.Y., a corporation of Delaware Filed July 1, 1963, Ser. No. 291,650
3 Claims. (Cl. 307—88.5)

The present invention generally relates to differential pulse integrators and, more particularly, to a differential pulse integrator utilizing a pair of transistors in complementary symmetry arrangement to provide linear integration of the difference between two input pulse trains.

Differential pulse integrators are well-known in the vacuum tube art and are discussed, for example, in section 14.6 of "Waveforms," edited by Chance et al., Radiation Laboratory Series, volume 19, McGraw-Hill, 1959. Transistorized versions of such prior art integrators are readily derivable through well-known principles. The transistorized versions, however, are characterized by relatively low shunting impedances across the integrating capacitor which limit the time interval over which integration can be accomplished accurately.

One object of the present invention is to provide a transistorized pulse integrator presenting a relatively high shunting impedance across the capacitive integrating element.

Another object is to provide a differential pulse integrator utilizing transistors in complementary symmetry arrangement.

A further object is to provide a transistorized differential pulse integrator adapted to respond to the area but not the polarities of input pulse trains.

An additional object is to provide a differential pulse integrator utilizing transistors in a gain-producing complementary symmetry circuit arrangement.

These and other objects of the present invention as will appear from the reading of the following specification, are achieved by the provision of a pair of transistors of opposite conductivity type whose collector electrodes are connected to each other and coupled to ground by an output capacitor. The transistors quiescently are biased to cut off by the potential drop across a forward conducting diode connected between the base and emitter electrodes of each transistor. Sources of first and second input pulse trains are capacitively coupled between the base and emitter electrodes of respective transistors. A common base circuit configuration and a common emitter circuit configuration are provided. In both configurations, a net charge is developed across the output capacitor proportional to the integral of the difference between the charges transferred to said output capacitor by the individual pulses of the first and second input pulse trains. The sense of the net charge is determined solely by the relative areas of the pulses of each train and not by the polarities of the pulses of each train.

For a more complete understanding of the present invention, reference should be had to the following specification and to the appended figures of which:

Figure 1:
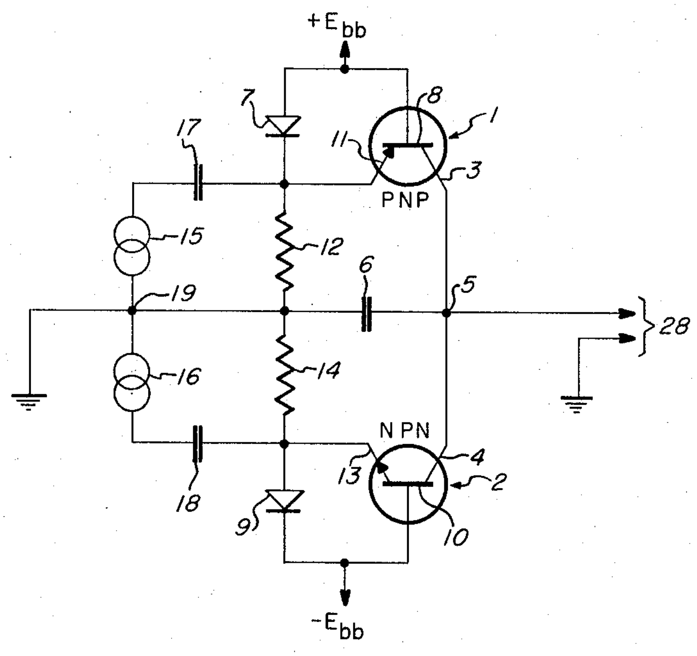
FIG. 1 is a schematic diagram of a common base species of the invention.

Referring to FIG. 1, transistors 1 and 2 are of opposite conductivity type. Collector 3 of PNP transistor 1 and collector 4 of NPN transistor 2 are connected to each other at junction 5. Junction 5 is coupled to ground via output capacitor 6. The anode of diode 7 is connected to the base 8 of transistor 1 and to a source of positive biasing potential ($+E_{bb}$). The cathode of diode 7 is connected to the emitter 11 of transistor 1 and to ground via resistor 12. The cathode of diode 9 is connected to the base 10 of transistor 2 and to a source of negative biasing potential ($-E_{bb}$). The anode of diode 9 is connected to the emitter 13 of diode 2 to ground via resistor 14. Thus, diodes 7 and 9 are quiescently biased for forward conduction by the respective biasing sources. The resulting potential drops across diodes 7 and 9 bias transistors 1 and 2, respectively, to cut off.

First pulse train source 15 is coupled via capacitor 17 to emitter 11 of transistor 1. Source 15 also is coupled to the base 8 of transistor 1 via grounded junction point 19 and the positive biasing source $+E_{bb}$. Similarly, second pulse train source 16 is coupled by capacitor 18 to emitter 13 of transistor 2. Source 16 additionally is coupled to the base 10 of transistor 2 via grounded junction point 19 and the negative biasing source $-E_{bb}$. In this manner, source 15 is coupled across the base and emitter electrodes of PNP transistor 1 whereas source 16 is coupled across the base and emitter electrodes of NPN transistor 2.

In operation, transistors 1 and 2 are held in the cut-off condition through the potential drop developed across the forward-biased diodes 7 and 9 as previously explained. Assuming, for the sake of illustration, that a positive pulse is produced by source 15 and is capacitively coupled to the emitter of transistor 1, diode 7 is rendered non-conductive and the emitter-to-base junction of transistor 1 becomes forward-biased, turning on transistor 1. Capacitor 17 is charged to the peak amplitude of the voltage pulse from source 15 through the forward conducting emitter-base junction of transistor 1. This action causes a flow of equivalent current in the collector circuit of transistor 1 to charge capacitor 6. Substantially equal charges are stored on capacitors 17 and 6 as a result of the pulses inasmuch as substantially all of the current delivered to emitter 11 flows through the collector electrode 3.

During the interval between pulses from source 15, capacitor 17 is discharged through the path comprising diode 7, the source of positive bias $+E_{bb}$ and the internal impedance of source 15. Substantially the same amount of charge flows through diode 7 as the amount of charge that flowed through the emitter-base junction of transistor 1 thereby restoring the charge on capacitor 17 to the value that existed prior to the pulse from source 15. The initial charge on capacitor 17 is determined by the potential drop across resistor 12 during the forward conduction of diode 7. It should be noted that the transient current flow through resistor 12 is negligible both during the charging and discharging of capacitor 17 because of the relatively large time constant of the current path including resistor 12 as opposed to the current paths containing the emitter-base junction of transistor 1 (charging path) and diode 7 (discharging path).

In the event that source 15 provides a pulse having an area identical to the area of the originally assumed positive pulse but of opposite polarity, substantially the same charge is transferred to capacitor 6. A negative pulse from source 15 charges capacitor 17 through forward conducting diode 7. Upon the termination of the negative pulse, diode 7 becomes back-biased by the charge on capacitor 17 but transistor 1 is rendered conductive whereby capacitor 17 is discharged via the emitter-base junction of transistor 1. The discharging of capacitor 17 through the forward conducting emitter-base junction of transistor 1 causes an equivalent current to flow in the collector circuit of transistor 1 to charge capacitor 6.

The operation of the portion of the circuit including transistor 2 is equivalent to the operation just described in connection with the circuit portion including transistor 1. The only differences are due to the use of NPN conductivity type for transistor 2 instead of a PNP conductivity type for transistor 1. Whereas a negative pulse from source 15 charges capacitor 17 through diode 7, a negative pulse from source 16 charges capacitor 18 through emitter-base junction of transistor 2. Whereas a positive pulse from source 15 charges capacitor 17 through the emitter-base junction of transistor 1, a positive pulse from source 16 charges capacitor 18 through diode 9. Irrespective of the polarity of the pulses from source 16, a charge is transferred to capacitor 6 equivalent to the charge produced in capacitor 18 by the pulse from source 16.

Equal charges flowing through the collectors of transistors 1 and 2 produce equal and opposite changes in charge on capacitor 6 because of the complementary symmetry circuit arrangement. Hence, the net charge developed in output capacitor 6 is specifically the difference between the sum of all the charges entering input capacitor 17 and the sum of all the charges entering input capacitor 18. A series of uniform area input pulses applied to either capacitor 17 or capacitor 18 will cause the potential across capacitor 6 to step in voltage by equal amounts for each applied pulse irrespective of the polarity of the applied pulse. The direction or sense in which the voltage changes across output capacitor 6 is determined solely by which of the input capacitors 17 and 18 the input pulses are applied to.

It should be observed that the charges on input capacitors 17 and 18 are always reset to the same level after each input pulse has subsided regardless of the amplitude of the input pulses. Inasmuch as the original charge level is re-established on capacitors 17 and 18 during the time between pulses, the charge transferred to output capacitor 6 as a result of each pulse is proportional to the amplitude and duration of the current pulse from either sources 15 or 16. The charge transferred to and stored by capacitor 6 during a given period is proportional to the integral of the pulse currents over the given period.

Figure 2:
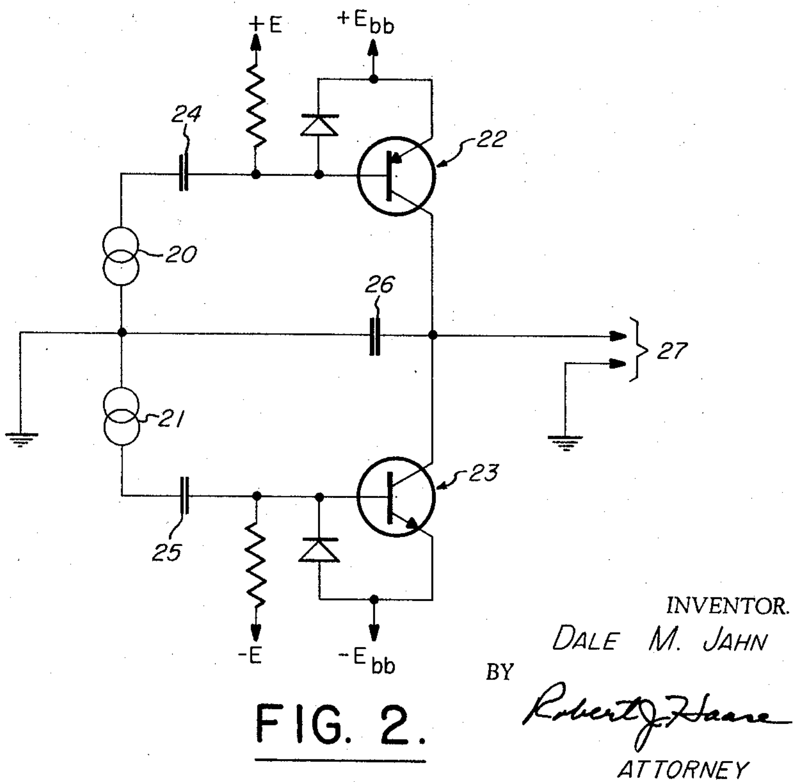
FIG. 2 is a schematic diagram of a common emitter species of the invention.

In the common emitter circuit configuration represented in FIG. 2, the pulses from sources 20 and 21 are applied across the base-emitter junctions of transistors 22 and 23. In particular, the current pulse from source 20 is applied via capacitor 24 into the base of transistor 22 rather than into the emitter as in the case of transistor 1 of FIG. 1. Similarly, the pulse from source 21 is applied by capacitor 25 into the base of transistor 23 rather than into the emitter as in the case of transistor 2 of FIG. 1. In every other respect, the circuit represented in FIG. 2 is equivalent to the circuit of FIG. 1. Inasmuch as the current pulses drive the bases of transistors 22 and 23, the charge transferred to output capacitor 26 is greater by the amount of current gain provided by transistors 22 and 23 than the corresponding charges on capacitors 24 and 25. No current gain is achieved in the circuit of FIG. 1. Thus, the circuit of FIG. 2 produces a charge across output capacitor 26 which is equivalent to the integral of the difference between the areas of the pulse trains from sources 20 and 21 multiplied by a constant factor which is the current gain factor of transistors 22 and 23. A potential equal to the aforesaid integral is made available across output terminals 27 in FIG. 2. If identical pulse trains are provided by sources 15 and 20 and by sources 16 and 21, the potential at terminals 27 will be greater than the potential at output terminals 28 of FIG. 1 by the amount of current gain provided by transistors 22 and 23.

While the invention has been described in its preferred embodiments, it is understood that the words which have been used are words of description rather than of limitation and that changes within the purview of the appended claims may be made without departing from the true scope and spirit of the invention in its broader aspects.

What is claimed is:

1. A differential pulse integrator comprising
a first transistor,
a second transistor of conductivity type opposite to that of said first transistor,
each transistor having base, emitter and collector electrodes, the collector electrodes of said first and second transistors being connected to each other at a first junction,
means connected to the base and emitter electrodes of said first and second transistors to bias said first and second transistors to cut-off,
a first source for producing a first train of pulses,
a second source independent of said first source for producing a second train of pulses,
the pulses of said second train having areas independent of the areas of the pulses of said first train,
said sources being connected to each other at a second junction,
a capacitor for applying said first train of pulses between the base and emitter electrodes of said first transistor,
a capacitor for applying said second train of pulses between the base and emitter electrodes of said second transistor and
a capacitor connected between said first and second junctions.

2. A differential pulse integrator as defined in claim 1 wherein said means to bias said first and second transistors to cut-off includes
a first diode connected across the base and emitter electrodes of said first transistor and
a second diode connected across the base and emitter electrodes of said second transistor.

3. A differential pulse integrator comprising
a PNP transistor,
an NPN transistor,
the collectors of said PNP and NPN transistors being connected to each other at a first junction,
means including a first diode connected to the base and emitter electrodes of said PNP transistor to bias said PNP transistor cut-off,
the anode of said first diode being connected to the base of said PNP transistor and the cathode of said first diode being connected to the emitter of said PNP transistor,
means including a second diode connected to the base and emitter electrodes of said NPN transistor to bias said NPN transistor to cut-off,
the anode of said second diode being connected to the emitter of said NPN transistor and the cathode of said second diode being connected to the base of said NPN transistor,
a first source for producing a first train of pulses,
a second source for producing a second train of pulses,
said sources being connected to each other at a second junction,
a capacitor for applying said first train of pulses between the base and emitter electrodes of said PNP transistor,
a capacitor for applying said second train of pulses between the base and emitter electrodes of said NPN transistor, and
a capacitor connected between said first and second junctions.

References Cited by the Examiner

UNITED STATES PATENTS

| | | | |
|---|---|---|---|
| 2,860,193 | 11/1958 | Lindsay | 330—17 |
| 2,864,961 | 12/1958 | Lohman et al. | 307—88.5 |
| 3,125,694 | 3/1964 | Palthe | 307—88.5 |
| 3,169,194 | 2/1965 | Kermode | 307—88.5 |
| 3,195,068 | 7/1965 | Du Vall | 307—88.5 |
| 3,231,827 | 1/1966 | Legler | 330—17 |

JOHN W. HUCKERT, *Primary Examiner.*

J. D. CRAIG, *Assistant Examiner.*